(12) United States Patent
Morganelli et al.

(10) Patent No.: US 6,624,216 B2
(45) Date of Patent: Sep. 23, 2003

(54) NO-FLOW UNDERFILL ENCAPSULANT

(75) Inventors: Paul Morganelli, Upton, MA (US); Anthony DeBarros, Billerica, MA (US); Brian Wheelock, Sandown, NH (US); Jayesh Shah, Plaistow, NH (US)

(73) Assignee: National Starch and Chemical Investment Holding Corporation, New Castle, DE (US)

( * ) Notice: Subject to any disclaimer, the term of this patent is extended or adjusted under 35 U.S.C. 154(b) by 0 days.

(21) Appl. No.: 10/062,906

(22) Filed: Jan. 31, 2002

(65) Prior Publication Data

US 2003/0149135 A1 Aug. 7, 2003

(51) Int. Cl.$^7$ .................. C08K 5/5419; C08L 63/02
(52) U.S. Cl. .................. 523/435; 523/456; 525/533; 528/94; 528/112; 528/113; 528/408; 528/419; 528/421
(58) Field of Search .................. 523/435, 456; 525/533; 528/94, 112, 113, 408, 419, 421

(56) References Cited

U.S. PATENT DOCUMENTS 6,180,696 B1    1/2001   Wong et al.

FOREIGN PATENT DOCUMENTS

JP         04178420    *    6/1992

OTHER PUBLICATIONS

Zhang, Zhuqing et al.: "Development of No–Flow Underfill Based on Non–Anhydride Curing System"; 2001 International Symposium on Advanced Packaging Materials.
Li, Haiying et al.: "A New Approach in the Development of No–Flow Underfill Materials for Both Eutectic and Lead–Free Solders with High Melting Temperature"; 2001 International Symposium on Advanced Packaging Materials.
Zhang, Z. Q. et al.: "Development of No–Flow Underfill Materials for Lead–Free Solder Bumped Flip–Chip Applications"; 2000 International Symposium on Advanced Packaging Materials.
Zhang, Zhuqing et al.: "Study of Curing Mechanism of Epoxy/Phenolic System for Underfill Applications"; 2001 International Symposium on Advanced Packaging Materials.
Usui, Hal et al.: "Special Characteristic of Future Flip Chip Underfill Materials and the Process"; 2000 IEEE.
Noro, Hiroshi et al.: "Study of Reliability and Process Ability for Preset Underfill Sheet Material As Future Standard Flip Chip Packaging Process"; 2000 IEEE.
Zhang, Zhuqing et al.: "Study of Non–Anhydride Curing System for No–Flow Underfill Applications"; 2001 IEEE.
Charles, Scott et al.: "Pre–Applied Underfill Adhesives for Flip Chip Attachment"; 2001 International Symposium on Microelectronics; pp. 178–183.
Morganelli, Paul, Ph.D. et al.: "Viscosity of a No–Flow Underfill during Reflow and Its Relationship to Solder Wetting"; 2001 IEEE.
Tech. Data Sheet XNF 1500 No Flow–Fluxing Underfill for Flip Chip, CSP, or BGA Devices.

* cited by examiner

Primary Examiner—Robert Dawson
Assistant Examiner—D. Aylward
(74) Attorney, Agent, or Firm—Charles W. Almer

(57) ABSTRACT

A curable underfill encapsulant composition which is especially useful in the no-flow underfill encapsulation process. The composition contains an epoxy resin, a fluxing agent, a linear polyanhydride and a catalyst. In an alternative embodiment, the composition also contains a linear anhydride. Various additives, such as surfactants and coupling agents may also be added to the composition.

39 Claims, 2 Drawing Sheets

NO-FLOW UNDERFILL ENCAPSULANT

FIELD OF THE INVENTION

The invention relates to an underfill encapsulant which may be utilized in no-flow underfilling processes.

BACKGROUND OF THE INVENTION

This invention relates to underfill encapsulant compounds prepared from epoxies to protect and reinforce the interconnections between an electronic component and a substrate in a microelectronic device. Microelectronic devices contain multiple types of electrical circuit components, mainly transistors assembled together in integrated circuit (IC) chips, but also resistors, capacitors, and other components. These electronic components are interconnected to form the circuits, and eventually are connected to and supported on a carrier or a substrate, such as a printed wire board. The integrated circuit component may comprise a single bare chip, a single encapsulated chip, or an encapsulated package of multiple chips. The single bare chip can be attached to a lead frame, which in turn is encapsulated and attached to the printed wire board, or it can be directly attached to the printed wire board.

Whether the component is a bare chip connected to a lead frame, or a package connected to a printed wire board or other substrate, the connections are made between electrical terminations on the electronic component and corresponding electrical terminations on the substrate. One method for making these connections uses polymeric or metallic material that is applied in bumps to the component or substrate terminals. The terminals are aligned and contacted together and the resulting assembly is heated to reflow the metallic or polymeric material and solidify the connection.

During its normal service life, the electronic assembly is subjected to cycles of widely varying temperature ranges. Due to the differences in the coefficient of thermal expansion for the electronic component, the interconnect material, and the substrate, this thermal cycling can stress the components of the assembly and cause it to fail. To prevent the failure, the gap between the component and the substrate is filled with a polymeric encapsulant, hereinafter called underfill or underfill encapsulant, to reinforce the interconnect material and to absorb some of the stress of the thermal cycling. In addition, the material helps to absorb impact energy and improve so-called "drop test" performance.

Two prominent uses for underfill technology are for reinforcing packages known in the industry as chip scale packages (CSP), in which a chip package is attached to a printed wire board, and flip-chip ball grid array (BGA) in which a chip is attached by a ball and grid array to a printed wire board.

In conventional capillary flow underfill applications, the underfill dispensing and curing takes place after the reflow of the metallic or polymeric interconnect. In this procedure, flux is initially placed on the metal pads on the substrate. Next, the chip is placed on the fluxed area of the substrate, on top of the soldering site, for the case of a metallic connection. The assembly is then heated to allow for reflow of the solder joint. At this point, a measured amount of underfill encapsulant material is dispensed along one or more peripheral sides of the electronic assembly and capillary action within the component-to-substrate gap draws the material inward. After the gap is filled, additional underfill encapsulant may be dispensed along the complete assembly periphery to help reduce stress concentrations and prolong the fatigue life of the assembled structure. The underfill encapsulant is subsequently cured to reach its optimized final properties.

The no-flow underfill process provides a more efficient procedure than that described above for attaching electronic components to a substrate and protecting the assembly with an underfill encapsulant. In the no-flow encapsulation process the flux is contained in the underfill which is applied to the assembly site prior to the component placement. After the component is placed, it is soldered to the metal pad connections on the substrate by passing the full assembly, comprising the component, underfill and substrate, through a reflow oven. During this process the underfill fluxes the solder and metal pads, the solder joint reflows, and the underfill cures. Thus, the separate steps of applying the flux and post-curing the underfill are eliminated via this process.

As soldering and cure of the underfill occur during the same step of the process, maintaining the proper viscosity and cure rate of the underfill material is critical in the no-flow underfill encapsulation process. The underfill must remain at a low viscosity to allow melting of the solder and the formation of the interconnections. It is also important that the cure of the underfill not be unduly delayed after the cure of the solder. It is desirable that the underfill in the no-flow process cure rapidly after the melting of the solder.

SUMMARY OF THE INVENTION

The invention relates to a curable underfill encapsulant composition which is especially useful in the no-flow underfill encapsulation process. The composition contains an epoxy resin, a fluxing agent, a linear polyanhydride and a catalyst. In an alternative embodiment, the composition also contains a cyclic anhydride. Various additives, such as surfactants and coupling agents may also be added to the composition.

DETAILED DESCRIPTION OF THE INVENTION

Figure 1:
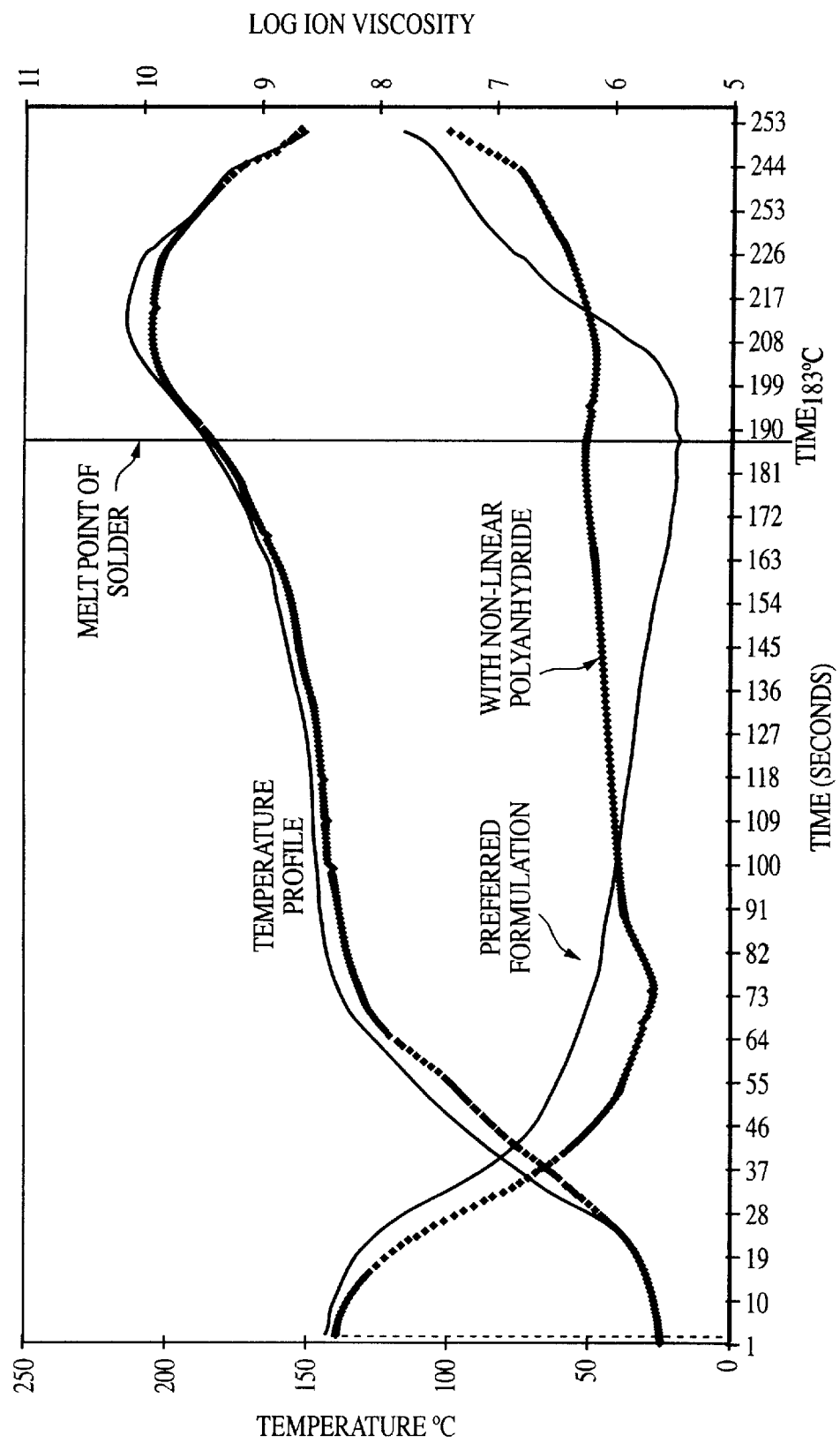
FIG. 1 is a comparison of the viscosity versus temperature of the no-flow underfill of the present invention and a no-flow underfill composition containing a non-linear polyanhydride.

The resins used in the underfill encapsulation composition of the present invention are curable compounds, which means that they are capable of polymerization. As used in this specification, to cure will mean to polymerize, with cross-linking. Cross-linking, as understood in the art, is the attachment of two polymer chains by bridges of an element, a molecular group, or a compound, and in general takes place upon heating.

Ingredients of the present invention include one or more epoxy resins, fluxing agents, linear polyanhydrides, and catalysts. Optionally, cyclic anhydrides, surfactants, reactive diluents and other ingredients may also be included. The ingredients are specifically chosen to obtain the desired balance of properties for the use of the particular resin.

Examples of epoxy resins suitable for use in the present underfill composition include monofunctional and multifunctional glycidyl ethers of Bisphenol-A and Bisphenol-F, and cycloaliphatic epoxy resins or a combination thereof.

The cycloaliphatic epoxides are preferably selected from non-glycidyl ether epoxides containing more than one 1.2 epoxy group per molecule. These epoxides are characterized by a ring structure wherein the epoxide group may be part of the ring or may be attached to the ring structure. Examples of non-glycidyl ether epoxides include 3,4-epoxycyclohexylmethyl-3,4-epoxycyclohexane carboxylate, which contains two epoxide groups that are part of the ring structures and an ester linkage, vinylcyclohexene dioxide, which contains two epoxide groups and one of which is part of the ring structure, 3,4-epoxy-6-methyl cyclohexyl methyl-3,4-epoxycyclohexane carboxylate and dicyclopentadiene dioxide.

Glycidyl ether epoxides are preferred in the invention, either separately or in combination with the non-glycidyl ether epoxides. These resins are selected from glycidyl ether epoxides containing more than one 1.2 epoxy group per molecule. A preferred epoxy resin of this type is bisphenol A resin. Preferred bisphenol A type resin includes 2,2-bis (4-hydroxyphenyl) propane-epichlohydrin copolymer. A most preferred epoxy resin is bisphenol F type resin. These resins are generally prepared by the reaction of one mole of bisphenol F resin and two moles of epichlorohydrin. A further preferred type of epoxy resin is epoxy novolac resin. Epoxy novolac resin is commonly prepared by the reaction of phenolic resin and epichlorohydrin. A preferred epoxy novolac resin is poly(phenyl glycidyl ether)-co-formaldehyde. Biphenyl type epoxy resin may also be utilized in the present invention. This type of resin is commonly prepared by the reaction of biphenyl resin and epichlorohydrin. Dicyclopentadiene-phenol epoxy resin, naphthalene resins, epoxy functional butadiene acrylonitrile copolymers, epoxy functional polydimethyl siloxane and mixtures thereof are additional types of epoxy resins which may be employed. The preferred epoxy for the underfill encapsulant of the present invention is bisphenol F type. A commercially available bisphenol-F type resin is available from CVC Specialty Chemicals, Maple Shade, N.J., under the designation 8230E. Bisphenol-A type resin is commercially available from Resolution Technology as EPON 828, and a blend of bisphenol-A and bisphenol-F is available from Nippon Chemical Company under the designation ZX-1059.

The linear polyanhydride of the invention must be chosen so that the no-flow underfill encapsulant maintains a low viscosity below the melting point of the solder and also just above the melting point of the solder long enough to allow the solder and metal pads to interconnect. The linear polyanhydride used in the underfill encapsulant is multifunctional. The initial reaction with the resin is to cleave the polymeric anhydride chain, thereby decreasing molecular weight. This is shown schematically in the diagram below:

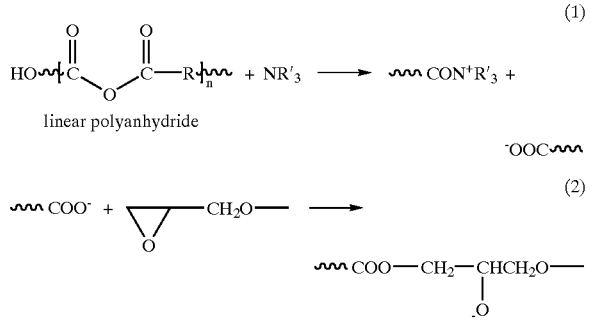

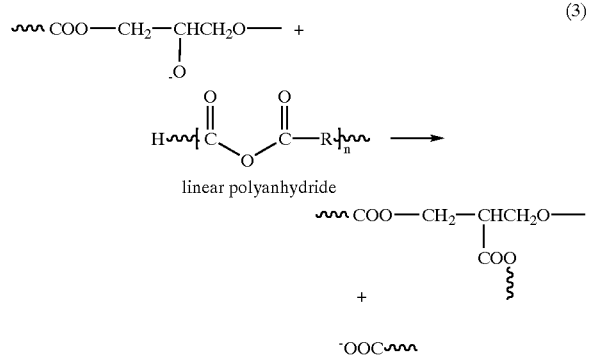

Figure 2:
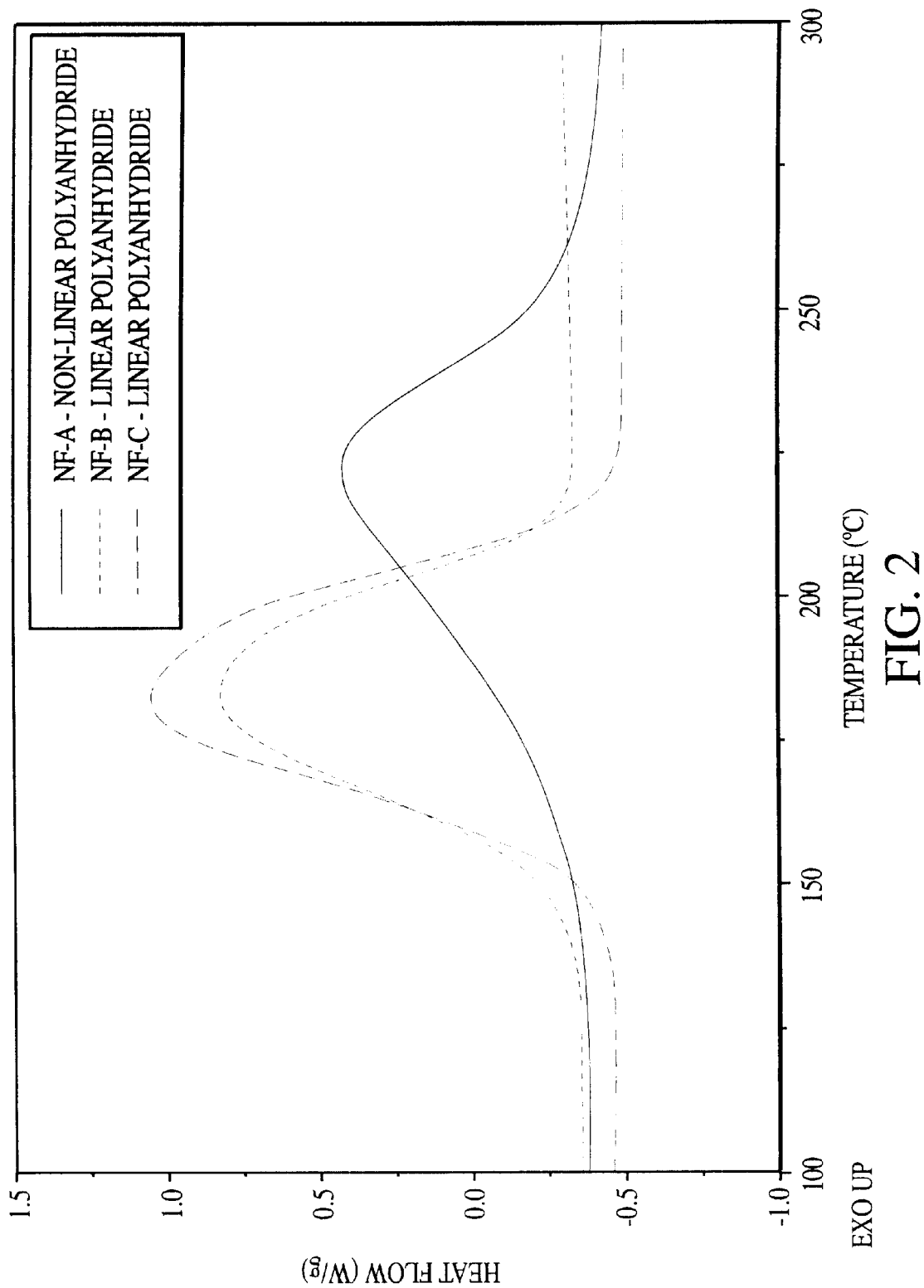
FIG. 2 is a comparison of the reactivity of the no-flow underfill of the present invention and a no-flow underfill composition containing a non-linear polyanhydride.

In step (1), the linear polyanhydride chain is cleaved by the catalyst. In this scheme, R is a 4–10 carbon linear polymethylene segment. In step (2), the usual carboxylate-epoxy reaction is initiated. In step (3) the alkoxide ion of the epoxy again reacts to cleave another polyanhydride chain. The cleaving process, by reducing the molecular weight of the polyanhydride, in effect delays the increase in viscosity. Thus, with no delay in the curing process, the composition of the invention remains at low viscosity for an extended period of time. The molecular weight inevitably begins to rise at higher extents of cure. In addition, the linear polyanhydride functions as a fluxing agent. The preferred linear polyanhydride is polysebacic polyanhydride (PSPA) which is formed from the dehydration of sebacic acid. The preferred PSPA is available as PSPA from Lonza, Inc., Intermediates and Additives, Pasadena, Tex. Other linear polyanhydrides which may be utilized include polyazelaic polyanhydride and polyadipic polyanhydride. As shown in FIG. 1, the viscosity of an underfill encapsulant containing a linear polyanhydride decreases during reflow until after the solder melt point, at which point the viscosity increases as curing continues. FIG. 2 illustrates the benefits in reactivity of the underfill composition containing a linear polyanhydride versus an underfill composition containing a non-linear polyanhydride, i.e., the benefit of providing a decreasing viscosity during the initial stages of the curing/reflow process and the fluxing the solder and metal pads by the polyanhydride. FIGS. 1 and 2 also illustrate that the formulation having a linear polyanhydride provides rapid reactivity without a rapid rise in viscosity. A further advantage of the linear polyanhydride is that it is a low vapor pressure solid. Consequently, at elevated temperatures above the crystalline melting point there is little tendency for the polyanhydride to volatilize and create voids in the curing underfill.

A catalyst is preferably utilized in the underfill encapsulant. A preferred catalyst is 1-cyanoethyl-2-ethyl4-methyl-imidazole. This material is a liquid imidazole, preferably blocked or protected for delayed reactivity, and is commercially available under the trade name CURIMID-DN, from Poly Organix, Inc., Newburyport, Mass. Other useful catalysts include AMICURE 2PIP (Air Products & Chemicals, Allentown, Pa.), alkyl-substituted imidazole, triphenylphosphine, imidazolium salts, imidazole phosphate, imidazole salts, onium borate, metal chelates, and mixtures thereof.

In underfill formulations containing a linear polyanhydride, the linear polyanhydride imparts a great deal of flexibility to the cured composition. Such flexibility is desirable in certain uses, such as assembly of CSP's. A more rigid cured composition is desirable in certain other uses, such as those uses requiring increased durability in thermal shock reliability tests. In these cases requiring a more rigid composition, it is desirable to incorporate a second anhydride or higher functionality epoxy into the formula to provide higher rigidity and higher glass transition temperature. The preferred second anhydride is preferably a cycloaliphatic anhydride and most preferably methylhexahydro phthalic anhydride (MHHPA), which is commercially available as MHHPA from Lonza. Other cyclic anhydrides which may be utilized, especially to increase the glass transition temperature, include methyltetra-hydrophthalic anhydride, nadic methyl anhydride, hexa-hydro phthalic anhydride, tetra-hydro phthalic anhydride, phthalic anhydride, dodecyl succinic anhydride, or mixtures thereof. In the underfill encapsulant formulation containing both a linear polyanhydride and a cyclic anhydride, the ratio of the two components is preferably stoichiometric. Further, the preferred formulation should be substantially free of reacting species that would vitiate the effects of the linear polyanhydride by increasing viscosity too early and by accelerating the cross-linking process.

Additional ingredients may be added to the underfill encapsulant to produce a composition with the desired properties. For example, monofunctional reactive diluents can incrementally delay the increase in viscosity without adversely affecting the physical properties of the cured underfill. A preferred diluent is p-tert-butyl-phenyl glycidyl ether, although other diluents such as allyl glycidyl ether, glycerol diglycidyl ether, glycidyl ether or alkyl, butanediodiglydidylether and mixtures thereof may be utilized. Surfactants may be utilized to aid in the prevention of process voiding during the flip-chip bonding process and subsequent solder joint reflow and material curing. Various surfactants which may be utilized include organic acrylic polymers, silicones, polyoxyethylene/polyoxypropylene block copolymers, ethylene diamine based polyoxyethylene/polyoxypropylene block copolymers, polyol-based polyoxyalkylenes, fatty alcohol-based polyoxyalkylenes, fatty alcohol polyoxyalkylene alkyl ethers and mixtures thereof. In addition, coupling agents, polymeric modifiers and other ingredients may also be added as desired.

A preferred embodiment of the formulation of the underfill encapsulant of the present invention comprises an epoxy resin, a linear polyanhydride that functions as a fluxing agent, a catalyst, and other ingredients as desired, such as a surfactant. The epoxy resin may comprise in the range of about 25 to about 95 wt % epoxy resin. Preferably, the underfill will comprise in the range of about 35 to about 65 wt % of the epoxy resin. The formulation also comprises in the range of about 2 wt % to about 50 wt % of the linear polyanhydride which contains a fluxing agent. More preferably the underfill will comprise in the range of about 5 wt % to about 35 wt % of the linear polyanhydride curing agent. The linear polyanhydride is preferably in particles that are smaller than 50 microns. Finally, additional ingredients may also be added as desired. In a preferred formulation, in the range of about 0.05 wt % to about 1.0 wt %, and more preferably about 0.1 wt % to about 0.25 wt % of a catalyst is added and in the range of about 0 wt % to about 0.75 wt %, and more preferably about 0.2 wt % to about 0.6 wt % of a surfactant is also added.

In an alternative embodiment, the underfill encapsulant comprises an epoxy resin, a linear polyanhydride, a cyclic anhydride, a catalyst, and additional ingredients as desired, such as a surfactant. The epoxy resin may comprise in the range of about 25 to about 95 wt % epoxy resin. Preferably, the underfill will comprise in the range of about 35 wt % to about 65 wt % of the epoxy resin. The formulation also comprises in the range of about 2 wt % to about 40 wt % of the linear polyanhydride. More preferably the underfill will comprise in the range of about 5 to about 30 wt % of the linear polyanhydride. The linear polyanhydride is preferably in particles that are smaller than 50 microns. The underfill will comprise in the range of about 0 wt % to about 45 wt % of the cyclic anhydride. Preferably, the underfill will comprise in the range of about 0 wt % to about 30 wt % of the cyclic anhydride. Finally, additional ingredients may also be added as desired. In a preferred formulation, in the range of about 0.05 wt % to about 1.0 wt %, and more preferably about 0.1 wt % to about 0.25 wt % of a catalyst is added and in the range of about 0 wt % to about 0.75 wt %, and more preferably about 0.2 wt % to about 0.6 wt % of a surfactant is also added.

The invention may be better understood by reference to the following example.

EXAMPLE 1

An underfill encapsulant composition was formulated containing 55 wt % Bis-F epoxy resin (8230E, available from CVC), 22 wt % polysebacic polyanhydride (PSPA, available from Lonza), 22 wt % methylhexahydrophthalic anydride (MHHPA, available from Lonza), 0.2 wt % of 1-cyanoethyl-2-ethyl-4-methyl-imidazole as a catalyst (available from Poly Organix, Inc.) and 0.4 wt % of a surfactant. The composition was prepared by adding the bisphenol-F epoxy resin to a stainless steel vessel. The MHHPA was then added, with mechanical stirring. The PSPA, in the form of a micronized powder with particle size less than 20 microns, was added with stirring. The temperature of the composition was adjusted to about 20–25° C., and the imidazole catalyst was added. The surfactant was added next. The composition was mixed for about 15 minutes and de-aired under vacuum.

The composition was tested before curing and the results are shown in Table 1:

TABLE 1

Properties of Uncured Underfill Encapsulant

| Property | Test Method | Value Range |
| --- | --- | --- |
| Chemical Type | | Epoxy |
| Appearance | Visual | Translucent, off-white |
| Density | ASTM-D-792 | 1.18 g/cm$^3$ |
| Brookfield Viscosity | ASTM-D-2393 10 rpm #4 | 3.5 Pa.s 3,500 cP |

The properties of the cured underfill encapsulant are shown in Table 2:

TABLE 2

Properties of Cured Underfill Encapsulant

| Property | Test Method | Value Range |
| --- | --- | --- |
| Water Absorption 24 Hour Boil | ASTM-D-570-81 | <2.0% |
| Coefficient of Thermal Expansion | ASTM-D-3386 | 75 × 10$^{-6}$/° C. |
| Glass Transition Temperature | ASTM-D-3418 | 60° C. |
| Extractable Ions | 24 hour extraction, boiling water | |
| Cl$^-$ | | <20 ppm |
| Na$^+$ | | <10 ppm |

TABLE 2-continued

Properties of Cured Underfill Encapsulant

| Property | Test Method | Value Range |
|---|---|---|
| K+ | | <10 ppm |
| Storage Modulus @ 25° C. | 3 point bend (1 Hz) | 2.4 GPa |

The performance and reliability data for the cured underfill encapsulant used to attach a 200×300 mil CSP to 60 mil printed wire board is illustrated in Table 3. The soldering yield was measured by placing a number of solder spheres onto OSP coated copper in the presence of the underfill material and exposing the assembly to standard reflow conditions of 2.25 minutes at 150° C. and 1 minute at 220° C. and measuring the percentage of solder spheres that are able to connect to the copper through fluxing and spreading.

TABLE 3

Performance and Reliability of Cured Underfill Encapsulant

| Property | Test Method | Value |
|---|---|---|
| Soldering Yield | Standard Reflow | 100% |
| Reliability (200 × 300 CSP) | −55° C. to +125° C. Thermal Shock | >1000 shock cycles |

EXAMPLES 2–5

Underfill compositions for Examples 2–5 were made according to the process described in Example 1. The compositions of each underfill material are set out in Table 4:

TABLE 4

Compositions of Underfill Encapsulants

| Material | Example 2 | Example 3 | Example 4 | Example 5 |
|---|---|---|---|---|
| | Parts | | | |
| Bisphenol-F/Bisphenol A Epoxy Blend | 39 | 37 | 59 | 51 |
| Epoxy- terminated dimer acid | | 12 | | |
| Epoxy-functional CTBN | | 15 | | |
| Epoxy-functional CTBN (containing reactive diluent) | 26 | | | |
| Polysebacic polyanhydride | 18 | 17 | 36 | |
| Non-linear polyanhydride | | | | 49 |
| MHHPA | 18 | 17 | 0 | 0 |
| Imidazole catalyst | 0.2 | 0.2 | 1 | 0.2 |

The properties of each underfill encapsulant of Examples 2–5 are shown in Table 5:

TABLE 5

Properties of Underfill Encapsulants

| Property | Example 2 | Example 3 | Example 4 | Example 5 |
|---|---|---|---|---|
| Viscosity, cP | 12,000 | 5,500 | 14,000 | 11,000 |
| Storage Modulus of cured underfill, MPa | 800 | 1,100 | 200 | N/D |
| Onset of Cure | 155 | 188 | 110 | 135 |
| % Yield during reflow | 100 | 100 | 100 | 0 |

The examples illustrate that a high soldering yield may be obtained with a number of different epoxy types. Example 5 also illustrates the negative effect of non-linear polyanhydride on percentage yield.

We claim:
1. A no-flow underfill encapsulant material comprising:
   a) one or more epoxy resins;
   b) one or more linear polyanhydride; and
   c) one or more catalysts,
wherein the material is substantially free of non-linear polyanhydrides.
2. The no-flow underfill encapsulant of claim 1, wherein the epoxy resin is selected from the group consisting of 3,4-epoxycyclohexylmethyl-3,4-epoxycyclohexane carboxylate, vinylcyclohexene dioxide, 3,4-epoxy-6-methyl cyclohexyl methyl-3,4-epoxycyclohexane carboxylate, dicyclopentadiene dioxide, bisphenol A resin, 2,2-bis(4-hydroxyphenyl) propane-epichlorohydrin copolymer, bisphenol F type resin, epoxy novolac resin, poly(phenyl glycidyl ether)-co-formaldehyde, biphenyl type epoxy resin, dicyclopentadiene-phenol epoxy resins, naphthalene epoxy resins, epoxy functional butadiene acrylonitrile copolymers, epoxy functional polydimethyl siloxane, and mixtures thereof.
3. The no-flow underfill encapsulant of claim 2, wherein the epoxy resin comprises bisphenol-F epoxy resin containing more than one 1.2 epoxy group or molecule.
4. The no-flow underfill encapsulant of claim 3, wherein the epoxy resin comprises in the range of about 25 wt % to about 95 wt % of the encapsulant.
5. The no-flow underfill encapsulant of claim 4, wherein the epoxy resin comprises in the range of about 35 wt % to about 65 wt % of the encapsulant.
6. The no-flow underffll encapsulant of claim 5, wherein the epoxy resin is a mixture of bisphenol A and bisphenol F type epoxy resins.
7. The no-flow underfill encapsulant of claim 1, wherein the linear polyanhydride comprises polysebacic polyanhydride, polyazelaic polyanhydride, polyadipic polyanhydride or mixtures thereof.
8. The underfill encapsulant of claim 7, wherein the linear polyanhydride comprises polysebacic polyanhydride.
9. The underfill encapsulant of claim 7, wherein the linear polyanhydride comprises in the range of about 2 wt % to about 50 wt % of the encapsulant.
10. The underfill encapsulant of claim 9, wherein the linear polyanhydride comprises in the range of about 5 wt % to about 35 wt % of the encapsulant.
11. The underfill encapsulant of claim, 1, wherein the catalyst is an imidazole.
12. The underfill encapsulant of claim 11, wherein the imidazole is blocked or protected for delayed reactivity.
13. The underfill encapsulant of claim 12, wherein the catalyst is selected from the group consisting of 1-cyanoethyl-2-ethyl4-methyl-imidazole, alkyl-substituted imidazole, triphenylphosphine, imidazolium salts, imidazole phosphates, onium borate, metal chelates, and mixtures thereof.

14. The underfill encapsulant of claim 12, wherein the catalyst comprises in the range of about 0.05 wt % to about 1 wt % of the encapsulant.

15. The underfill encapsulant of claim 14, wherein the catalyst comprises in the range of about 0.1 wt % to about 0.25 wt % of the encapsulant.

16. The underfill encapsulant of claim 1, wherein the encapsulant further comprises one or more of the group consisting of surfactants, coupling agents, reactive diluents, polymeric modifiers or mixtures thereof.

17. The underfill encapsulant of claim 16, wherein the surfactant is selected from the group consisting of organic acrylic polymers, silicones, polyoxyethylene/polyoxypropylene block copolymers, ethylene diamine based polyoxyethylene/polyoxypropylene block copolymers, polyol-based polyoxyalkylenes, fatty alcohol-based polyoxyalkylenes, fatty alcohol polyoxyalkylene alkyl ethers and mixtures thereof.

18. The underfill encapsulant of claim 16, wherein the reactive diluent is selected from the group consisting of p-tert-butyl-phenyl-glycidyl ether, allyl glycidyl ether, glycerol diglycidyl ether, glycidyl ether or alkyl, butanediodiglydidylether and mixtures thereof.

19. The underfill encapsulant of claim 2, further comprising a cyclic anhydride.

20. The underfill encapsulant of claim 19, wherein the cyclic anhydride is a cycloaliphatic anhydride.

21. The underfill encapsulant of claim 20, wherein the cyclic anhydride is selected from the group consisting of methylhexa-hydro phthalic anhydride methyltetrahydrophthalic anhydride, nadic methyl anhydride, hexahydro phthalic anhydride, tetra-hydrophthalic anhydride, dodecyl succinic anhydride, phthalic anhydride and mixtures thereof.

22. The underfill encapsulant of claim 21, wherein the cyclic anhydride comprises in the range of about 0 wt % to about 30 wt % of the encapsulant.

23. The underfill encapsulant of claim 20, wherein the epoxy resin comprises in the range of about 25 wt % to about 95 wt % of the encapsulant.

24. The underfill encapsulant of claim 23, wherein the epoxy resin comprises in the range of about 35 wt % to about 65 wt % of the encapsulant.

25. The no-flow underfill encapsulant of claim 23, wherein the epoxy resin is selected from the group consisting of 3,4-epoxycyclohexylmethyl-3,4-epoxycyclohexane carboxylate, vinylcyclohexene dioxide, 3,4-epoxy-6-methyl cyclohexyl methyl-3,4-epoxycyclohexane carboxylate, dicyclopentadiene dioxide, bisphenol A resin, 2,2-bis(4-hydroxyphenyl) propane-epichlohydrin copolymer, bisphenol F type resin, epoxy novolac resin, poly(phenyl glycidyl ether)-co-formaldehyde, biphenyl type epoxy resin, dicyclopentadiene-phenol epoxy resins, naphthalene epoxy resins, epoxy functional butadiene acrylonitrile copolymers, epoxy functional polydimethyl siloxane, and mixtures thereof.

26. The no-flow underfill encapsulant of claim 25, wherein the epoxy resin is a mixture of bisphenol A and bisphenol F type epoxy resins.

27. The no-flow underfill encapsulant of claim 20, wherein the linear polyanhydride comprises polysebacic polyanhydride, polyazelaic polyanhydride, polyadipic polyanhydride or mixtures thereof.

28. The underfill encapsulant of claim 27, wherein the linear polyanhydride comprises polysebacic polyanhydride.

29. The underfill encapsulant of claim 28, wherein the linear polyanhydride comprises particles that are equal to or smaller than 50 microns.

30. The underfill encapsulant of claim 27, wherein the linear polyanhydride comprises in the range of about 2 wt % to about 50 wt % of the encapsulant.

31. The underfill encapsulant of claim 30, wherein the linear polyanhydride comprises in the range of about 5 wt % to about 35 wt % of the encapsulant.

32. The underfill encapsulant of claim 20, wherein the catalyst is an imidazole.

33. The underfill encapsulant of claim 32, wherein the imidazole is blocked or protected for delayed reactivity.

34. The underfill encapsulant of claim 20, wherein the catalyst is selected from the group consisting of 1-cyanoethyl-2-ethyl-4-methyl-imidazole, alkyl-substituted imidazole, triphenylphosphine, imidazolium salts, imidazole phosphates, onium borate, metal chelates, and mixtures thereof.

35. The underfill encapsulant of claim 32, wherein the catalyst comprises in the range of about 0.05 wt % to about 1 wt % of the encapsulant.

36. The underfill encapsulant of claim 35, wherein the catalyst comprises in the range of about 0.1 wt % to about 0.25 wt % of the encapsulant.

37. The underfill encapsulant of claim 20, wherein the encapsulant further comprises one or more of the group consisting of surfactants, coupling agents, reactive diluents, polymeric modifiers and mixtures thereof.

38. The underfill encapsulant of claim 37, wherein the surfactant is selected from the group consisting of organic acrylic polymers, silicones, polyoxyethylene/polyoxypropylene block copolymers, ethylene diamine based polyoxyethylene/polyoxypropylene block copolymers, polyol-based polyoxyalkylenes, fatty alcohol-based polyoxyalkylenes, fatty alcohol polyoxyalkylene alkyl ethers and mixtures thereof.

39. The underfill encapsulant of claim 37, wherein the reactant diluent comprises p-tert-butyl-phenyl-glycidyl ether, allyl glycidyl ether, glycerol diglycidyl ether, glycidyl ether or alkyl, butanediodiglydidylether and mixtures thereof.

* * * * *